United States Patent [19]
Cole et al.

[11] Patent Number: 4,897,153
[45] Date of Patent: Jan. 30, 1990

[54] METHOD OF PROCESSING SILOXANE-POLYIMIDES FOR ELECTRONIC PACKAGING APPLICATIONS

[75] Inventors: Herbert S. Cole, Scotia; James E. Kohl, Schenectady, both of N.Y.

[73] Assignee: General Electric Company, Schenectady, N.Y.

[21] Appl. No.: 342,153

[22] Filed: Apr. 24, 1989

[51] Int. Cl.$^4$ .................. B44C 1/22; C03C 15/00; B29C 37/00; B32B 31/00
[52] U.S. Cl. .................................. 156/643; 134/1; 134/3; 156/629; 156/633; 156/644; 156/646; 156/651; 156/655; 156/668; 156/272.6; 156/272.8; 204/192.36; 219/121.69; 219/121.85; 427/38; 427/307; 427/309
[58] Field of Search .............. 156/629, 633, 643, 644, 156/646, 651, 655, 668, 272.6–272.8; 204/192.32, 192.35, 192.36–192.37; 134/1, 3; 427/38, 39, 307, 309; 252/79.1, 79.3; 219/121.68, 121.69, 121.85

[56] References Cited
U.S. PATENT DOCUMENTS

| | | | |
|---|---|---|---|
| 4,504,349 | 3/1985 | Ueno et al. | 156/272.6 |
| 4,731,156 | 3/1988 | Montmarquet | 156/643 |
| 4,764,485 | 8/1988 | Loughran et al. | 437/225 |
| 4,772,348 | 9/1988 | Hirokawa et al. | 156/272.6 |

Primary Examiner—William A. Powell
Attorney, Agent, or Firm—Robert Ochis; James C. Davis, Jr.; Marvin Snyder

[57] ABSTRACT

A method of forming a multilayer metallization pattern using siloxane polyimide dielectric layers comprises forming the first siloxane polyimide layer, laser etching holes in the first layer, plasma etching the first layer to be sure the holes are clean, then cleaning the surface of the first layer in an etchant for silicon oxide, after which the metallization layer is formed and patterned and a second siloxane polyimide layer is formed thereover with good adhesion.

24 Claims, 1 Drawing Sheet

METHOD OF PROCESSING SILOXANE-POLYIMIDES FOR ELECTRONIC PACKAGING APPLICATIONS

RELATED APPLICATIONS

U.S. Pat. application Ser. No. 912,457, filed Sept. 26, 1986, by C. W. Eichelberger et al. Pat. No. 4,866,508, and entitled "Integrated Circuit Packaging Configuration for Rapid Customized Design and Unique Test Capability"; U.S. Pat. No. 4,783,695 to C. W. Eichelberger et al. entitled "Multichip Integrated Circuit Packaging Configuration and Method; U.S. Pat. application Ser. No. 240,367, filed Aug. 30, 1988, as a continuation of application Ser. No. 912,458, filed Sept. 26, 1986, by C. W. Eichelberger et al., abandoned, and entitled "Method and Apparatus for Packaging Integrated Circuit Chips Employing a Polymer Film Overlay Layer"; U.S. Pat. application Ser. No. 230,654 filed Aug. 5, 1988, as a continuation of application Ser. No. 912,454, filed Sept. 26, 1986, by C. W. Eichelberger et al., abandoned, and entitled "Method of Configuration for Testing Electronic Circuits and Integrated Circuit Chips Using a Removable Overlay Layer"; U.S. Pat. application Ser. No. 249,927, filed Sept. 27, 1988, by R.J. Wojnarowski et al. and entitled "Method and Apparatus for Removing Components Bonded to a Substrate"; U.S. Pat. application Ser. No. 312,798, filed Feb. 21, 1989, by R.J. Wojnarowski et al., and entitled "High Density Interconnect Thermoplastic Die Attach Material and Solvent Die Attach Processing"; U.S. Pat. application Ser. No. 283,095, filed Dec. 12, 1988, by C. W. Eichelberger et al. and entitled "Simplified Method for Repair of High Density Interconnect Circuits"; U.S. Pat. application Ser. No. 305,314, filed Feb. 3, 1989, by H. S. Cole, Jr. et al and entitled "Integrated Circuit Test Structure and Test Process" and U.S. Pat. application Ser. No. 312,536, filed Feb. 17, 1989, as a continuation-in-part of application Ser. No. 156,138, filed Feb. 16, 1988, by R.J. Wojnarowski it al. and entitled "Method of Bonding a Thermoset Film to a Thermoplastic Material to Form a Bondable Laminate"; U.S. Pat. No. 4,617,085 to H.S. Cole, Jr. et al., entitled "Process for Removing Organic Material in a Patterned Manner From an Organic Film"; U.S. Pat. No. 4,714,516 to C.W. Eichelberger et al. entitled, "Method to Produce Via Holes in Polymer Dielectrics for Multiple Electronic Circuit Chip Packaging"; U.S. Pat. No. 4,764,485 to J.W. Loughran et al. entitled, "Method for Producing Via Holes in Polymer Dielectrics"; and U.S. Pat. application Ser. No. 310,489, filed Feb. 14, 1989, by C. W. Eichelberger et al. entitled, "Laser Beam Scanning Method for Forming Via Holes in Polymer Materials". Each of these patent applications and patents is assigned to the present assignee and is incorporated herein by reference.

FIELD OF THE INVENTION

The present invention relates to the field of forming multilayer circuit structures with polymer dielectrics, and more particularly, to the field of forming such structures employing copolymer dielectrics.

BACKGROUND OF THE INVENTION

The above-identified related patents and patent applications disclose a method of fabricating multichip integrated circuits employing polymer dielectric overlayers having via holes therein and patterned metallization layers thereon for interconnection of contact pads of the various integrated circuits within themselves, to each other and to external circuits. Briefly, the process comprises laminating a first polymer dielectric layer which may preferably be a polyimide over the integrated circuit chips which are disposed on a substrate. Thereafter, via holes are preferably formed in the dielectric layer in alignment with contact areas on the various integrated circuit chips which are to be connected via the patterned metallization. This via hole formation is preferably done using laser drilling by one of the processes described in the related U.S. Pat. Nos. 4,617,085, 4,714,516 and 4,764,485 or patent application Ser. No. 310,489, filed Feb. 14, 1989, all cited above, or by any other appropriate process. Thereafter, a metallization layer is formed over the polymer dielectric and patterned to provide the desired metallization pattern. In order to form a multilayer metallization pattern, a second polymer dielectric layer is then formed over the first polymer layer and the first metallization layer. This second dielectric layer may preferably comprise a siloxane polyimide copolymer. Following the formation of this siloxane polyimide layer, via holes are laser drilled to provide openings for electrical connection to the first metallization layer. The structure is then plasma etched to ensure that all debris is removed from the via holes prior to deposition of the second metal layer. After patterning of the second metal layer, a second layer of siloxane polyimide dielectric may be formed over the first layer of siloxane polyimide dielectric and the metallization pattern thereon to provide additional interconnection structures. We have found that when this is done, the second siloxane polyimide copolymer layer has a crazed or cracked appearance and has an exposed surface which is rippled or rough. This surface is sufficiently rough that formation of a patterned layer of metal thereon becomes difficult. These characteristics raise substantial reliability concerns with respect to electronic systems in which interconnections are made in this manner.

A method is needed for reliably forming high quality, multilayer siloxane polyimide dielectric structures having patterned metallization layers within the siloxane polyimide structure.

OBJECTS OF THE INVENTION

A primary object of the present invention is to provide a process for forming a multilayer siloxane polyimide structure having patterned metallization layers within the structure in a manner which is free of crazing and cracking of the dielectric layers.

A further object of the present invention is to provide a method of ensuring that a subsequently applied siloxane polyimide copolymer layer will adhere firmly to an initial siloxane polyimide copolymer layer which has been plasma etched.

SUMMARY OF THE INVENTION

The present invention accomplishes the above and other objects which will become apparent from the remainder of the specification by forming a first siloxane polyimide layer, forming via holes therein, treating the first siloxane polyimide layer to remove debris from the via holes, cleaning the first siloxane polyimide copolymer layer in an etchant for silicon oxide to remove a substantially inorganic surface layer containing silicon, oxygen and fluorine to leave a cleaned surface having substantially the same composition as an untreated siloxane polyimide layer and forming a second siloxane polyimide layer over the first siloxane polyimide layer.

This cleaning process is appropriate for rendering the surface of the first siloxane polyimide layer suitable for formation of the second siloxane polyimide layer, independent of the particular treatment steps which created the substantially inorganic surface layer.

BRIEF DESCRIPTION OF THE DRAWING

The subject matter which is regarded as the invention is particularly pointed out and distinctly claimed in the concluding portion of the specification. The invention, however, both as to organization and method of practice, together with further objects and advantages thereof, may best be understood by reference to the following description taken in connection with the accompanying drawing in which:

DETAILED DESCRIPTION

Figure 1:
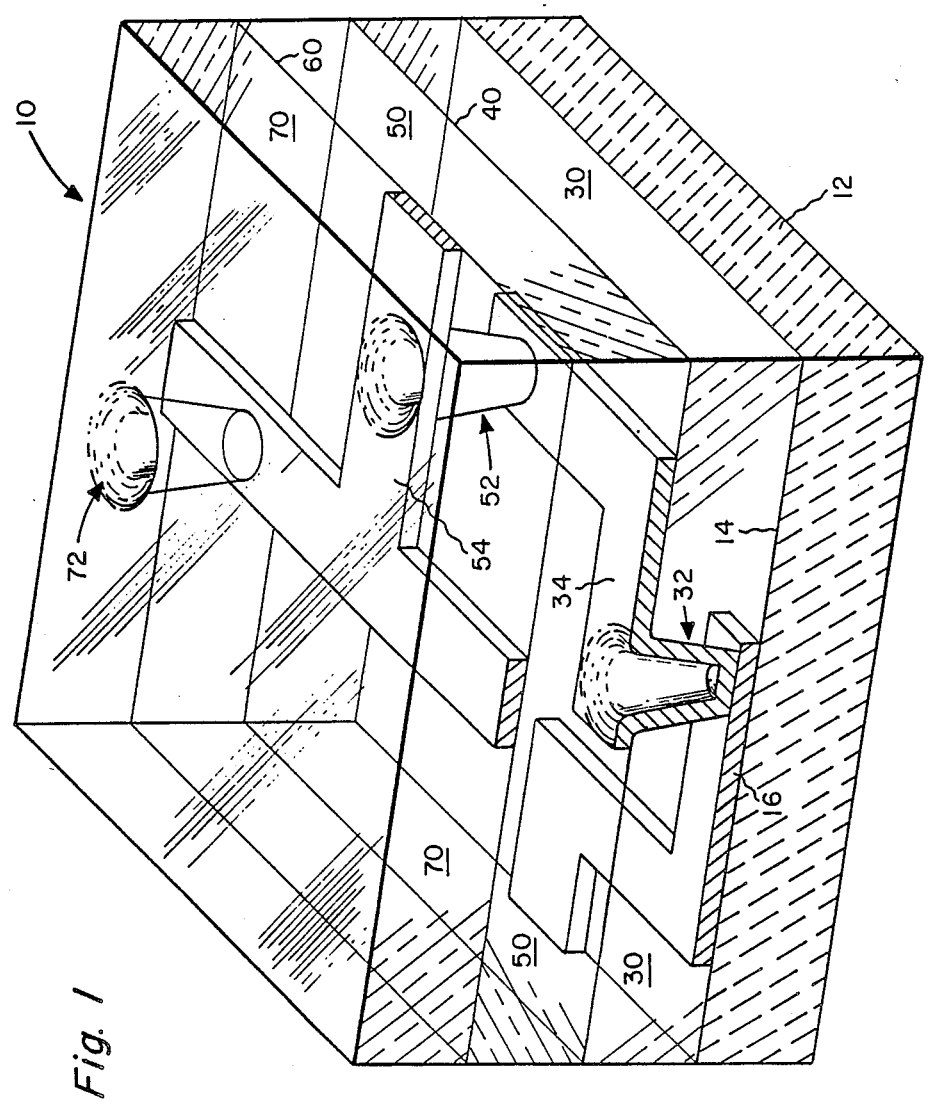
FIG. 1 is a perspective cutaway illustration of a multilayer copolymer/metallization interconnection structure for providing connections within an electronic system.

In FIG. 1, a multilayer dielectric/conductor structure is shown generally at 10. This structure comprises a substrate 12 having an upper surface 14 on which a metallization pattern 16 is disposed. The substrate 12 may take any desirable form including an insulating structure, an integrated circuit chip, a plurality of integrated circuit chips, and so forth. In order to provide the desired electronic system, the metallization pattern 16, which normally comprises a plurality of spaced apart metal conductors, must be interconnected with other conductors in a desired manner. As taught in the above-identified related applications, this may be accomplished by laminating a dielectric layer such as Kapton ® polyimide as sold by DuPont de Nemours Company onto the metallization 16 and the upper surface 14 of substrate 12 using an ULTEM ® polyetherimide resin as sold by the General Electric Company as a thermoplastic adhesive to bond the polyimide to the surface of metallization 16 and substrate 12. In the FIG., the polyimide and the polyetherimide are illustrated as a single layer 30. Thereafter, via holes such as the via hole 32 are laser drilled in the polyimide layer 30 in the manner taught in the above-identified related applications and patents. Thereafter, a metallization pattern 34 is disposed on the upper surface of the dielectric layer 30. This metallization pattern 34 may be deposited in a patterned manner or may be formed by depositing a uniform layer and then selectively removing material to leave the desired pattern 34. The metallization layer 34 extends down into the via holes 32 and into electrical contact with the metallization layer 16 in order to connect layer 34 to layer 16. Where a multilayer metallization interconnection pattern is needed, a second polymer film 50 is then formed over the polymer film 30 and the metallization pattern 34. This second polymer film may preferably be a spun-on siloxane polyimide copolymer such as SPI-129 as sold by HULS America, Inc., of Phoenix, Ariz. SPI-129 is believed to be a solution comprising 29% solids in a diglyme xylene solvent. This material is preferred because it adheres well to clean polyimide layers and metallization, may be applied and dried at temperatures below the softening point of the ULTEM ® polyetherimide resin which glues the Kapton ® polyimide to the substrate and is compatible with the rest of the process and structure. It is preferred to form the siloxane polyimide copolymer layer 50 in two steps by forming a first 6-micron-thick layer by spinning on the SPI-129, as it is received from the vendor, on top of the layer 30 and metallization 34, drying that coating and then spinning on a second 6-micron-thick coating which is then dried, after which a baking step at 200° C. for one-half hour is employed to ensure that substantially all the solvent has been removed from this copolymer layer. At the end of this baking step, the two spun-on siloxane polyimide layers have merged to form a single film 50 without any identifiable interface between the two initially spun-on portions. However, the interface 40 between the polyimide layer 30 and the siloxane polyimide layer 50 remains identifiable although the excellent adhesion between the siloxane polyimide and the polyimide provide what is effectively a single continuous dielectric body which is not susceptible to delamination. Thereafter, via holes are laser drilled in this siloxane polyimide dielectric layer in a manner taught in the related applications and patents. Following the laser drilling step, the siloxane polyimide layer is plasma etched in a plasma preferably containing oxygen and $CF_4$, although either one alone may suffice, to remove any debris within the via holes or which is deposited on the upper surface of the copolymer layer 50 during the laser drilling.

Prior to our invention, a metallization pattern 54 was then formed on top of the layer 50 and in the via holes 52 and a second siloxane polyimide copolymer layer was formed in the same manner as the first. Unfortunately, the resulting layer 70 exhibited cracking and crazing when viewed from above. These cracks and crazes appeared to be primarily at the interface 60 between the layers 50 and 70, but these cracks and crazes raised substantial reliability concerns with respect to the long term durability of the resulting structure. Further, the exposed surface of this layer was undesirably rough.

In an effort to overcome this problem, we had the surface of as-formed SPI-129 layers and of SPI-129 layers following $O_2/CF_4$ plasma etching surface analyzed. The resulting surface analysis is shown in the first and second lines of the table. As can be seen, the post-plasma etching surface is substantially inorganic in nature and is rich in silicon, oxygen and fluorine as compared to the unetched surface. We have found that by cleaning the etched surface of the siloxane polyimide copolymer layer in an etchant such as dilute HF for a brief period such as about 10 seconds, the inorganic coating is removed from the siloxane polyimide surface. The surface analysis of an etched siloxane polyimide surface following this cleaning step is shown in the third line of the table. As can be seen, this composition is substantially the same as that of the unetched siloxane polyimide copolymer.

TABLE

| SAMPLE | % C | % O | % N | % Si | % F |
|---|---|---|---|---|---|
| SPI-129 layer | 66 | 17 | 3 | 14 | — |
| SPI-129 layer after $O_2$—$CF_4$ plasma etching | 6 | 44 | 0.5 | 31 | 18 |
| After HF etching | 66 | 21 | 3 | 10 | — |

Other etchants than dilute HF may be used. It is believed that for this copolymer, it is important that the cleaning solution be one which etches silicon oxide. However, other solutions which successfully remove this surface material may be used.

Following this cleaning step, we formed the metallization layer 54 and the layer 70 of siloxane polyimide copolymer on top of the layer 50. The resulting structure was free of cracking and crazing and so far as we could determine, formed a strong, unified body of siloxane polyimide copolymer material having the metallization pattern 54 in the interior thereof, that is, the interface 60 shown between layers 50 and 70 essentially disappeared, although its original location could still be determined from the location of the metallization pattern 54. Thereafter, via holes 72 were laser drilled in the layer 70, followed by plasma etching, another cleanup HF etch and deposition of an additional metallization layer 74. Successive layers of metallization and siloxane polyimide may be formed as desired.

It is our conclusion from our work, that in fact the plasma etch degrades and removes the polyimide component of the copolymer faster than it degrades and removes the siloxane component of the copolymer and it is this which causes the inorganic surface layer which is rich in silicon and oxygen to remain on the surface. It is also thought that fluorine which is released during the plasma etching process may react to form Si—O—F bonds on the surface of the siloxane polyimide layer. It is believed that it is the silicon, oxygen and fluorine containing surface layer which causes the formation of a rough surface on the subsequently formed siloxane polyimide layer if the cleaning step is omitted Independent of the concerns about the crazing and cracking eventually extending through the entire siloxane polyimide layer, the surface of that second siloxane polyimide layer is rough rather than smooth and thus does not provide a good surface for formation of a subsequent metallization layer. When our cleaning step is used before formation of a subsequent siloxane polyimide copolymer layer, that layer is uniform, disposed everywhere in intimate contact with the initial layer, has a smooth exposed surface and, at the completion of the process, forms a substantially uniform block without a significant interface between the layers other than in the locations where metallization is present. SPI-129 is considered a desirable material for the second and subsequent layers of dielectric material because it sticks well to the surface of a clean Kapton ® polyimide layer and also sticks well to a clean SPI-129 layer. Consequently, there is no concern about delamination of these layers during the use of the electronic system.

The use of dilute HF solution to clean the etched surface of layer 50 does not raise reliability concerns because the rest of the structure is inert to the HF solution, since any integrated circuit chips are already encapsulated. In general, it is preferred that the metallization layers 34 and 54 comprise an initial sputtered layer of titanium followed by a thick layer of copper and a thin layer of titanium in order to provide good adhesion between the metallization layer and the underlying and overlying dielectric layers. The HF cleaning solution will attack the exposed surface of titanium at the bottom of the via holes. However, this does not raise reliability concerns since the HF solution will not attack the underlying copper and because the next step in the process is a short back sputtering to ensure that the exposed metal surfaces are clean followed immediately by sputtering a titanium layer of 1,000 Å after which a 3,000 Å copper layer is sputtered on the titanium. Thus, any titanium which is removed from the bottom of a via hole by the cleaning step is replaced by the following sputtering step. This is followed by electroplating of 3-5 microns of copper after which another 1,000 Å thick titanium layer is sputtered on. Thus, our cleanup process substantially enhances the integrity and reliability of the resulting multilayer interconnecting wiring structure. Chromium may be substituted for the titanium in this preferred three-layer metallization structure. Further, any other desired metallization composition may be used.

Siloxane polyimide materials other than the preferred SPI-129 may be used, if desired. Other silicon oxide etchants than HF, such as $NH_4HF_2$ (ammonium bifluoride) may be used, if desired. Further, the polymer layer 70 may have a different composition than layer 50 and may even be a polymer rather than a copolymer.

An alternative to plasma etching to remove debris from the via holes is to use an unfocused excimer laser beam (which has a fairly large diameter, on the order of about 1 cm) to clean the holes and surface by sweeping this beam across the surface in a manner which ensures sufficient exposure of all via holes to ensure that they are clean. This cleans the surface by ablating a thin layer from the exposed surface of the siloxane copolymer and thus removes any residual polymer in the laser-drilled via holes. This cleaning step also results in enrichment of the surface of the copolymer with oxygen and silicon relative to the surface of an untreated siloxane polyimide layer. The dilute HF solution discussed above is effective in substantially removing this enrichment. Other laser ablation processes, when performed on siloxane polyimide, should result in similar enrichment of the surface with silicon and oxygen. Thus, there are a variety of treatment processes which enrich the surface of siloxane polyimides with silicon and oxygen, thereby making the use of the cleaning step important.

While this invention has been described in terms of its utilization specifically with siloxane polyimide layers, it has a broader application in that we have discovered that an adhesion-interfering layer can result from the plasma etching of a copolymer under conditions which leave an inorganic layer on the surface and that these problems can be overcome by cleaning the resulting structure with an etchant for that inorganic material.

While the invention has been described in detail herein in accord with certain preferred embodiments thereof, many modifications and changes therein may be effected by those skilled in the art. Accordingly, it is intended by the appended claims to cover all such modifications and changes as fall within the true spirit and scope of the invention.

The invention claimed is:

1. A process comprising the steps of:
   forming a first copolymer layer;
   treating said first copolymer layer under conditions which leave the exposed surface of said first copolymer layer enriched with some elements of the copolymer formula;
   cleaning said exposed surface of said first copolymer layer with an etchant or solvent which substantially removes said enrichment to leave an exposed surface of said first copolymer layer which is substantially similar to that of an untreated surface of said copolymer; and
   forming a second copolymer layer on said exposed surface of said first copolymer layer.

2. The process recited in claim 1 wherein:
   after the treating step, the enriched surface of said first copolymer layer includes at least one element introduced by that treating step.

3. The process recited in claim 1 wherein the enriched exposed surface of said first copolymer layer is substantially inorganic in nature; and
    said cleaning step employs an etchant or solvent which removes that inorganic material.

4. The process recited in claim 1 wherein the treating step comprises the step of:
    plasma etching said first copolymer layer in an oxygen-containing plasma.

5. The process recited in claim 4 wherein in the plasma etching step, said plasma further comprises $CF_4$.

6. The process recited in claim 5 wherein:
    following the plasma etching step, the enriched exposed surface includes fluorine.

7. The process recited in claim 6 wherein:
    said first copolymer layer is a siloxane polyimide copolymer; and
    the exposed enriched surface is enriched with silicon, oxygen and fluorine relative to the composition of an unetched layer of that siloxane polyimide copolymer.

8. The process recited in claim 7 wherein the cleaning step comprises the step of
    exposing the surface of said first copolymer layer to an etchant or solvent which removes silicon oxide.

9. The process recited in claim 7 wherein:
    the cleaning etchant or solvent includes HF as an active component.

10. A method of forming a siloxane polyimide laminate comprising the steps of:
    forming a first siloxane polyimide copolymer layer;
    treating an exposed surface of said first siloxane polyimide copolymer layer in a manner which leaves the exposed surface of said first siloxane polyimide copolymer layer enriched with silicon and oxygen relative to an untreated surface of that siloxane polyimide copolymer;
    cleaning said exposed surface of said first siloxane polyimide copolymer with an etchant or solvent which removes silicon oxide; and
    forming a second siloxane polyimide copolymer layer on the cleaned exposed surface of said first siloxane polyimide copolymer layer.

11. The method recited in claim 10 further comprising the step of:
    forming a patterned metal layer on the exposed surface of said first siloxane polyimide copolymer layer prior to forming said second siloxane polyimide copolymer layer.

12. The method recited in claim 10 wherein:
    said treating step comprises etching said surface in an oxygen-containing plasma.

13. The method recited in claim 12 wherein said plasma further comprises $CF_4$.

14. The method recited in claim 13 wherein said step of cleaning comprises the step of:
    exposing said enriched surface of said first siloxane polyimide copolymer layer to an etchant or solvent which removes silicon oxide.

15. The method recited in claim 14 wherein:
    said etchant or solvent which removes silicon oxide comprises HF as an active component.

16. The method recited in claim 10 wherein:
    said treating step comprises etching said surface in a $CF_4$-containing plasma.

17. A method of forming a siloxane polyimide copolymer laminate comprising the steps of:
    forming a first siloxane polyimide copolymer layer;
    treating the exposed surface of said first siloxane polyimide copolymer layer in a manner which leaves a substantially inorganic coating of a silicon and oxygen containing substance on the exposed surface;
    removing said substantially inorganic coating to leave the exposed surface of said first siloxane polyimide copolymer layer with a surface composition which is substantially similar to that of an untreated layer of that siloxane polyimide copolymer; and
    forming a second layer of a siloxane polyimide copolymer on the cleaned, exposed surface of said first siloxane polyimide copolymer layer.

18. The method recited in claim 17 wherein:
    said step of removing said inorganic coating comprises cleaning the exposed surface with an etchant which removes said inorganic coating.

19. The method recited in claim 18 wherein:
    said etchant is one which removes silicon oxide.

20. The method recited in claim 19 wherein:
    said etchant includes HF as an active component.

21. A method comprising the steps of:
    treating a body of siloxane polyimide copolymer to remove a portion of said body, the treatment being one which leaves a portion of the surface of said body enriched with some elements of the copolymer formula relative to an untreated body of siloxane polyimide; and
    cleaning said portion of said surface with a fluid which substantially removes the enrichment.

22. The method recited in claim 21 wherein said treating step comprises a step selected from the group of steps consisting of plasma etching and laser ablating.

23. The method recited in claim 22 wherein said cleaning step comprises the step of etching or dissolving the enriched layer.

24. The method recited in claim 21 wherein said cleaning step comprises the step of etching or dissolving the enriched layer.

* * * * *